(12) United States Patent
Mochizuki et al.

(10) Patent No.: US 7,498,827 B2
(45) Date of Patent: *Mar. 3, 2009

(54) PROBE CARD

(75) Inventors: Jun Mochizuki, Nirasaki (JP); Hisatomi Hosaka, Nirasaki (JP)

(73) Assignee: Tokyo Electron Limited, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/710,221

(22) Filed: Feb. 23, 2007

(65) Prior Publication Data

US 2007/0290698 A1   Dec. 20, 2007

(30) Foreign Application Priority Data

Jun. 19, 2006  (JP) .............................. 2006-168790

(51) Int. Cl.
  *G01R 31/02*   (2006.01)
(52) U.S. Cl. ..................................... 324/754
(58) Field of Classification Search ................. 324/754; 29/874
See application file for complete search history.

(56) References Cited

U.S. PATENT DOCUMENTS

| | | | | | |
|---|---|---|---|---|---|
| 4,038,599 | A | * | 7/1977 | Bove et al. | 324/754 |
| 4,199,209 | A | * | 4/1980 | Cherian et al. | 439/591 |
| 4,618,821 | A | * | 10/1986 | Lenz | 324/754 |
| 5,534,784 | A | * | 7/1996 | Lum et al. | 324/757 |
| 6,426,636 | B1 | * | 7/2002 | Das et al. | 324/754 |
| 7,254,889 | B1 | * | 8/2007 | Cherian | 29/874 |
| 2004/0051541 | A1 | * | 3/2004 | Zhou et al. | 324/754 |
| 2004/0113640 | A1 | * | 6/2004 | Cooper et al. | 324/754 |
| 2005/0046431 | A1 | * | 3/2005 | Kirby | 324/754 |

FOREIGN PATENT DOCUMENTS

| | | |
|---|---|---|
| JP | H05-264589 | 10/1993 |
| JP | H07-012890 | 1/1995 |
| JP | H07-115110 | 5/1995 |
| JP | H08-271579 | 10/1996 |
| JP | H11-233216 | 8/1999 |
| JP | 2000-150598 | 5/2000 |
| JP | 2004-085261 | 3/2004 |
| JP | 2004-138452 | 5/2004 |
| JP | 2006-010629 | 1/2006 |

* cited by examiner

*Primary Examiner*—Ha Tran T Nguyen
*Assistant Examiner*—Joshua Benitez
(74) *Attorney, Agent, or Firm*—Masuvalley & Partners

(57) ABSTRACT

The present invention provides a probe card that can examine an object with small electrode spacing. A probe supporting plate is provided to a lower face side of a printed wiring board of a probe card. A plurality of probes are supported by the probe supporting plate. The probes comprise an upper contact, a lower contact, and a main body portion. An upper end portion of the upper contact protrudes toward an upper side of the probe supporting plate and contacts a terminal of the printed wiring board. A lower end portion of the lower contact protrudes toward a lower side of the probe supporting plate. On the probe supporting plate, a through-hole and a concave portion are formed to lock the probes, and the probes can be inserted and removed freely against the probe supporting plate from above.

6 Claims, 17 Drawing Sheets

Fig. 13
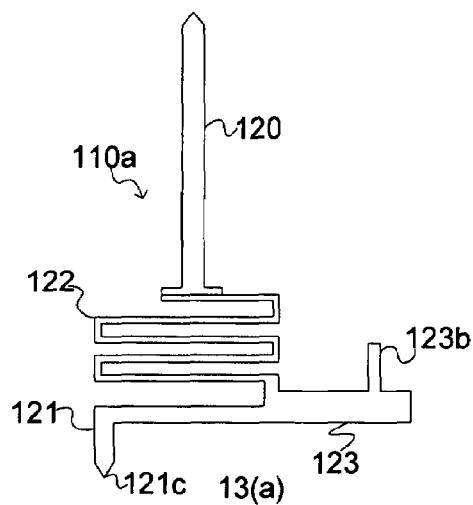
13(a)
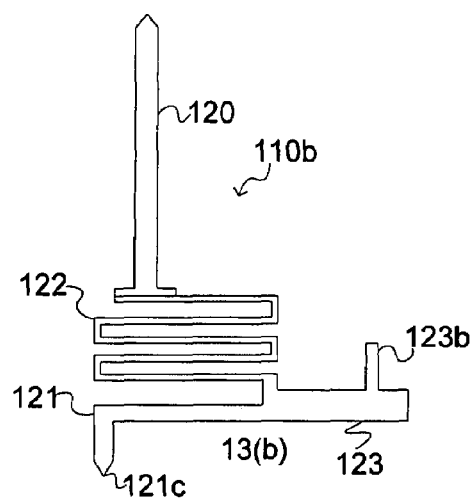
13(b)
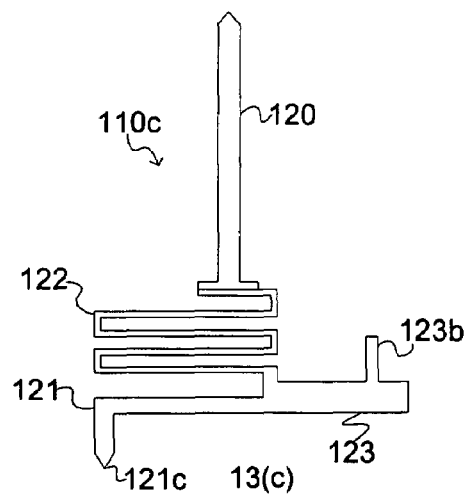
13(c)

PROBE CARD

TECHNICAL FIELD

The present invention relates to a probe card for examining electrical characteristics of an examination object, such as a wafer.

BACKGROUND OF INVENTION

Examinations of electrical characteristics of an electronic circuit, such as an IC or an LSI formed on a semiconductor wafer, have been typically carried out by the use of examination devices having a probe card. The probe card typically comprises plurality of probe pins to be contacted to a large number of electrodes on a wafer, and a circuit board transmits an electric signal to each probe for examination. The examination of the electric circuit on the wafer has been carried out in such way that each electrode of the wafer are brought into contact with each probe pin, and an electrical signal is transmitted from the circuit board to each probe.

In recent years, spacing between electrodes of an electronic circuit on a wafer are getting smaller, and are now down to approximately tens of μm to 100 μm due to miniaturization. Spacing for probes of the probe card need to be reduced to accommodate this, however, the spacing for terminals of a circuit board corresponding the probes can only be, for example, reduced to approximately 0.5 mm because it is necessary to maintain insulation between adjacent terminals while ensuring an adequate size of the terminal itself.

Under these circumstances, it has been proposed in Japanese published unexamined patent application No. 2004-191401 and so on to provide an interposer having an elasticity and a contactor having a fine wiring on the lower face side of the circuit board and mounting a probe on the lower face of the contactor. A lower face terminal of the circuit board is formed on the contactor, and a fine wiring is formed inside of the contactor to connect the upper face terminal and the lower face terminal. By this contactor internal wiring, wider spacing for the terminal of the circuit board is converted into small spacing for the electrode on the wafer.

However, in the above probe card, manufacturing has been taking time because it is necessary to form very complicated and fine wiring. Also, the probe card has become costly due to the necessity for designing a complicated wiring pattern and a complicated manufacturing process.

The present invention has been made in consideration of such points, and it is therefore an objective of the present invention to provide a probe card that can respond to an examination object such as a wafer with small electrodes spacing, and is also easy to manufacture and inexpensive.

BRIEF SUMMARY OF THE INVENTION

In order to achieve the above objective, the present invention is a probe card having a circuit board to transmit an electrical signal for an examination to a plurality of probes, and a probe supporting plate positioned on the lower face side of the circuit board to support with a plurality of probes inserted in a vertical direction, and a connecting plate intervened between the circuit board and the probe supporting plate to electrically connect the circuit board and each probe on the probe supporting plate, wherein on the probe supporting plate, the upper end portion of the probe protrudes upward of the probe supporting plate, and the lower end portion of the probe protrudes downward of the probe supporting plate, further an upper end portion and a lower end portion of each of the probes are shifted as viewed from a plane, wherein the plurality of probes are locked such that the spacing between the upper end portions of the plurality of probes can be changed to the spacing between the electrodes of an examination body at their lower end portion, and the connecting plate is formed by glass.

Also, a plurality of through-holes positioned in a vertical direction are formed on the connecting plate, and a conductive member which can freely move vertically within the through-hole and is longer than the through hole, is inserted into the through-hole, and an upper end portion of each probe may be contacted to the lower end portion of each conductive member.

The probe may be configured to be inserted and removed freely against the probe supporting plate. And the plurality of probes are locked to the probe supporting plate in a plurality of rows, the probes in each row are arranged aligning the upper end portion and the lower end portion in a substantially perpendicular direction of the arrangement direction viewed from a plane, the probes in each row are grouped with adjacent probes in a plurality of groups, and within each group, the spacing of the lower end portions of adjacent probes may be smaller than that of the upper end potions. Also, each group may be comprised of a plurality of types of probes that have different distances from the upper end portion to the lower end portion when viewed from a plane. Alternatively, the different types of probes may be arranged adjacent to each other.

Further, in order to achieve the above objective, a second invention is a probe card having a circuit board to transmit an electrical signal to a plurality of probes, a probe supporting plate positioned on the lower face side of the circuit board to support with a plurality of probes inserted in a vertical direction, and a connecting plate intervened between the circuit board and the probe supporting plate to electrically connect the circuit board and each probe on the probe supporting plate, wherein on the probe supporting plate, the upper end portion of the probe protrudes upward of the probe supporting plate, and the lower end portion of the probe protrudes downward of the probe supporting plate, wherein the probe comprises at least an upper portion, a main body portion and a lower portion, wherein the upper portion includes an upper end portion to contact the circuit board and an elasticity function against the vertical direction when the upper portion contacts the circuit board.

This lower portion of the probe may have a perpendicular portion having a lower end portion and a beam portion formed in a horizontal direction from the lower portion of the main body portion and connected to the perpendicular portion at its top end.

Further, the main body portion of the probe may be formed in a plate shape installed in a perpendicular face.

Further, in order to achieve the above objective, a third invention is a probe card having a circuit board to transmit an electrical signal to a plurality of probes, and a probe supporting plate positioned on the lower face side of the circuit board to support with a plurality of probes inserted in a vertical direction, and a connecting plate intervened between the circuit board and the probe supporting plate to electrically connect the circuit board and each probe on the probe supporting plate, wherein on the probe supporting plate, the upper end portion of the probe protrudes upward of the probe supporting plate, and the lower end portion of the probe protrudes downward of the probe supporting plate, wherein the probe has at least an upper portion, a main body portion and a lower portion, wherein the main body portion has an elasticity function against the vertical direction when the upper portion formed in a linear shape contacts the circuit board.

On the lower face side of this probe supporting plate, a groove is formed to arrange by aligning a plurality of probes, and a through-hole is penetrated by the upper portion of each probe, and may be formed on the bottom face of the groove.

Further, on the lower face adjacent to the groove on the probe supporting plate, a plurality of concave portions are formed in line along the groove, each probe has a locking portion to lock the probe to a probe supporting portion, and the concave portion to be engaged in the concave portion may be formed on each locking portion of each probe.

The locking portion on each probe may be attached to the concave portion with a resin curable by light or heat.

The adjacent concave portions may be formed on the positions where each distance from the groove is different.

This main body portion of probe may be in a serpentine form in a wave or a rectangular shape.

The locking portion of each probe may be mounted on a joint portion of the main body portion and the lower portion.

The lower portion of the probe may have a perpendicular portion having a lower end portion, and a beam portion formed in a horizontal direction from the lower portion of the main body portion and connected to the perpendicular portion at its top end.

According to the present invention, a probe card that can correspond to an examination body with small electrode spacing, and easy and inexpensive to manufacture, is realized.

BRIEF DESCRIPTION OF THE DRAWINGS

FIG. 13($a$) shows a probe with an upper contact located on center.

FIG. 13($b$) shows a probe with an upper contact located on a left side.

FIG. 13($c$) shows a probe with an upper contact located on a right side.

DETAILED DESCRIPTION OF INVENTION

Figure 1:
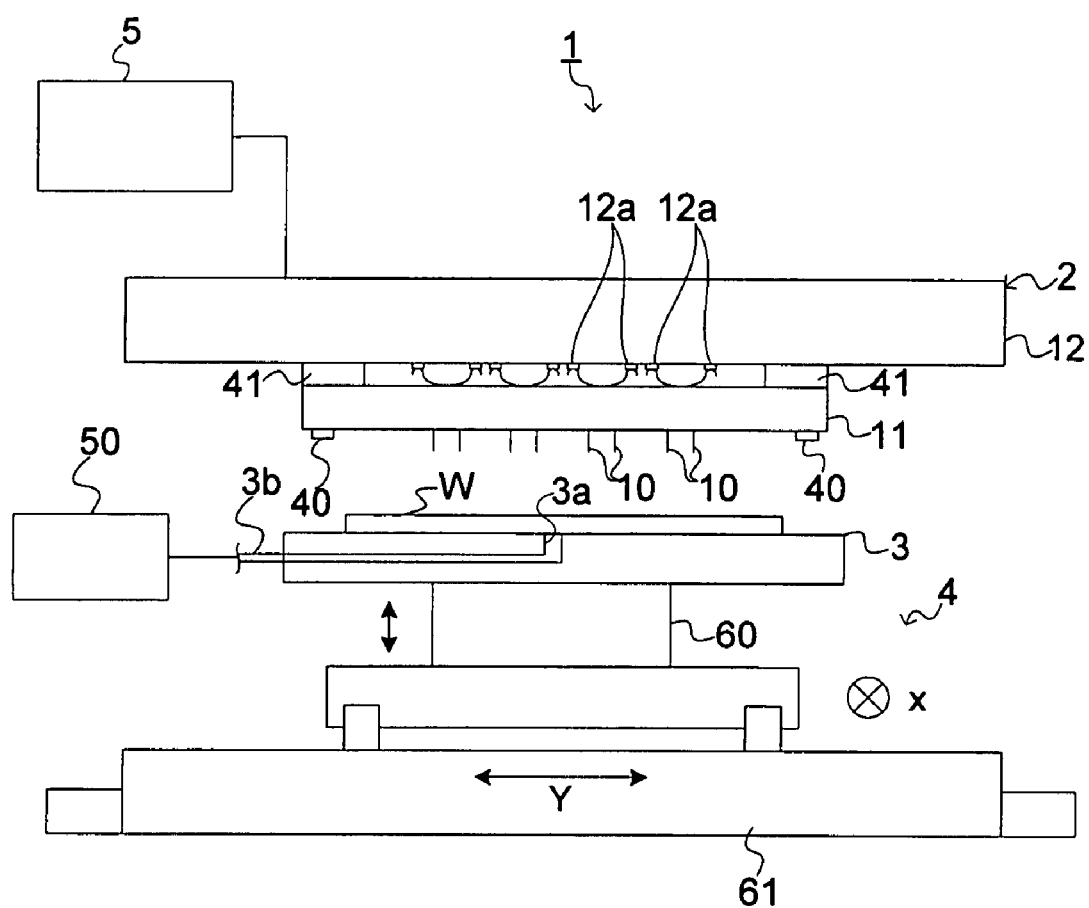
FIG. 1 is a side view showing an outline of a configuration for a probe in this embodiment.

A preferred embodiment of the present invention will hereinafter be described. FIG. 1 is an explanatory diagram showing a configuration of a probe 1 having a probe card according to the embodiment.

The probe 1 is provided with, for example, a probe card 2, a chuck 3 to stick and retain a wafer W, as an examination object, a moving mechanism 4 for moving the chuck 3, and a tester 5.

The probe card 2 is provided with, for example, a plurality of probes 10, a probe supporting plate 11 which supports the probe 10 while the probes 10 are inserted, and a printed wiring board 12 as a circuit board, attached on the upper face side of the probe supporting plate 11.

The printed wiring board 12 is electrically connected to the tester 5. Inside of the printed wiring board 12, a wiring for an electrical signal for examination to travel from the tester 5 is formed, and a plurality of terminals 12$a$ for the wiring are formed on a lower face of the printed wiring board 12.

Figure 2:
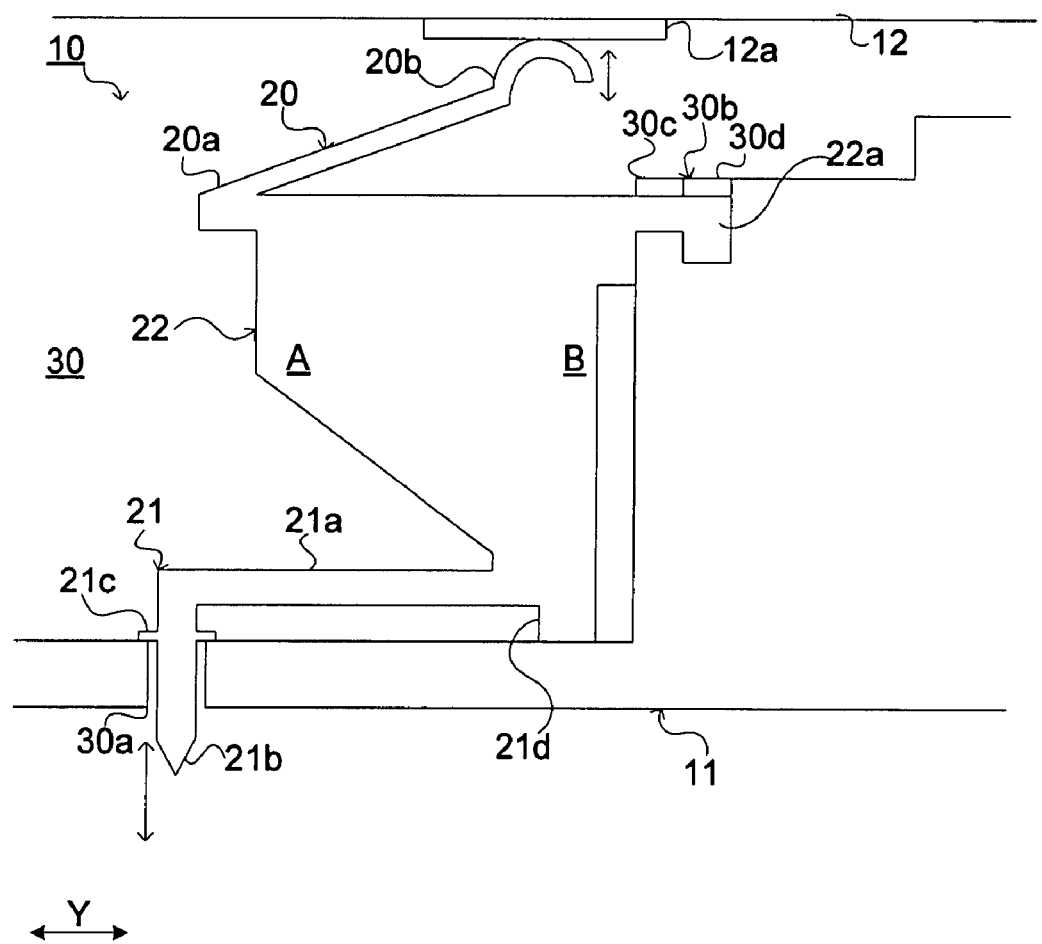
FIG. 2 is a longitudinal section of a probe supporting plate with a probed locked.

The probe 10 is, for example, formed in a thin plate shape, and, as shown in FIG. 2, provided with an upper contact 20 that contacts a terminal 12$a$ of the printed wiring board 12, a lower contact 21 which is brought into a contact with an electrode P of the a wafer W in an examination, and a main body portion 22 that connects the upper contact 20 and the lower contact 21. For example, Ni, a nickel alloy, such as Ni—Co alloy or Ni—Mn alloy, W, Pd, BeCu alloy, or Au alloy are used as a material of the probe 10. The probe 10 can also be plated with precious metal plating materials, or an alloy of these precious metal plating materials, and other metal plating materials on the surface of a base material made of a material described above.

For example, the main body portion 22 of the probe 10 is formed in a virtually square flat plate shape and having an inclined surface on a lower face of the one end A side (left side of FIG. 2). On the side face of the other end B side (right side of FIG. 2) of upper main body portion 22, an upper locking portion 22$a$ that is locked to the probe supporting plate 11 is formed. The upper locking portion 22$a$ is, for example, formed in a hook shape, protruding in a horizontal direction from the side face of the main body portion 22, and having its front end portion bending downward.

The upper contact 20 has, for example, a linear beam portion 20$a$ formed obliquely upward of the other end B side from an upper end of the A side of the main body portion 22, and a curvature portion 20$b$ which is convex and connected to the front end of the beam portion 20$a$. The upper contact 20 has elasticity in vertical directions because the beam portion 20$a$ bends in vertical directions. The curvature portion 20$b$ is pressed and contacted by the terminal 12$a$ of the printed wiring board 12. In addition, the uppermost part of the curvature portion 20$b$ is the upper end portion of the probe 10 in this embodiment.

The lower contact 21 has the linear beam portion 21$a$ formed in the horizontal direction from the other end B side towards the one end A side of the lower portion of the main body portion 22, and the perpendicular portion 21$b$, is connected to the top end of beam portion 21$a$, and is formed in a so-called cantilever shape. The perpendicular portion 21$b$ contacts the electrode P of wafer W at an examination. The lower contact 21 has elasticity in the vertical direction because the beam portion 21a bends in vertical directions. Around the upper portion of the perpendicular portion 21b, a lower locking portion 21c protrudes outward and is larger in diameter than other portions. Also, a stopper 21d protrudes downward on the lower face of the other end B side of the beam portion 21a. In addition, the top end of the perpendicular portion 21b is the lower end portion of probe 10 in this embodiment.

Figure 3:
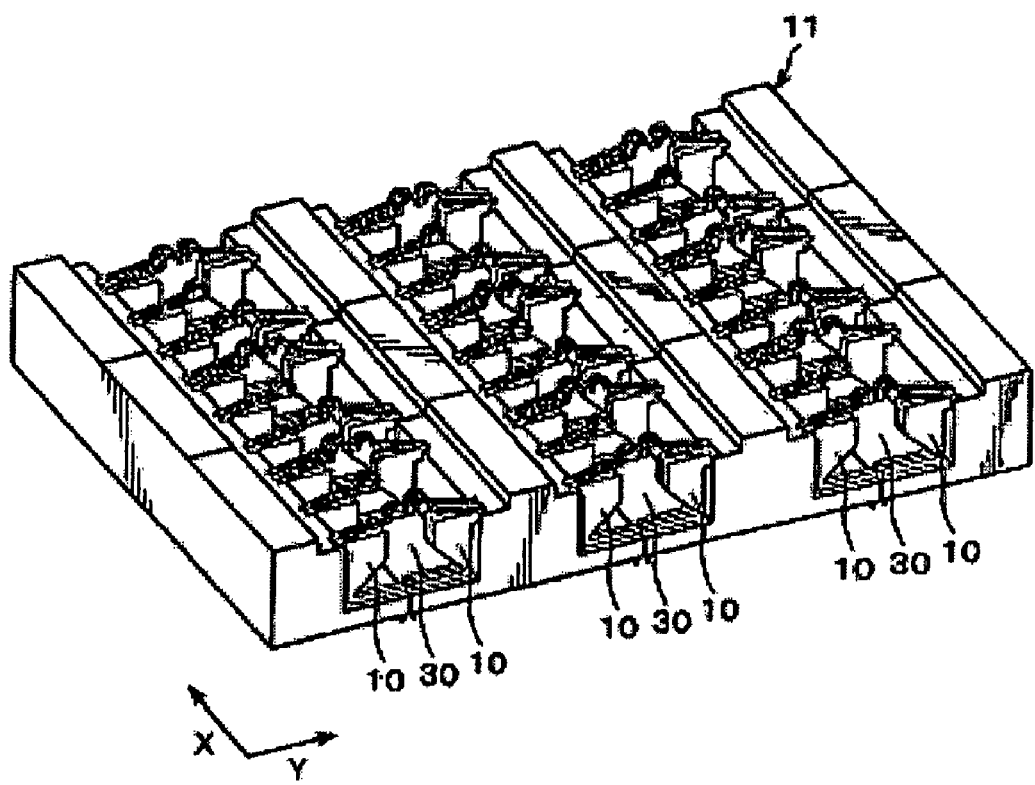
FIG. 3 is an explanatory diagram showing a condition of a probe supporting plate with a plurality of probes mounted.

The probe supporting plate 11 which supports the probe 10 above is, for example, formed in a square plate shape. The probe supporting plate 11 is formed with a low-thermal expansion material, such as ceramics. On an upper face side of the probe supporting plate 11, grooves 30 are formed, for example, in a plurality of rows towards a constant direction (X direction) as shown in FIG. 3. Two rows of probe 10, for example, are locked to each row of these grooves 30 so as to face each other.

The through-hole 30a penetrates the lower face of the probe supporting plate 11, as shown in FIG. 2, and is formed on a bottom face of the groove 30 of the probe supporting plate 11. Into this through-hole 30a, the perpendicular portion 21b of the lower contact 21 of probe 10 is inserted, and the lower end portion of the perpendicular portion 21b protrudes downward of the probe supporting plate 11. Also, the stopper 21d of the perpendicular portion 21a contacts the upper circumference edge of through-hole 30a to maintain horizontality of the beam portion 21a. In addition, the stopper 21d may be configured to inhibit the incline of the beam portion 21a and is usually slightly floating from the bottom face of grove 30, and may be configured to contact the bottom face of the grove 30 when the probe 10 is pressed downward.

Figure 4:
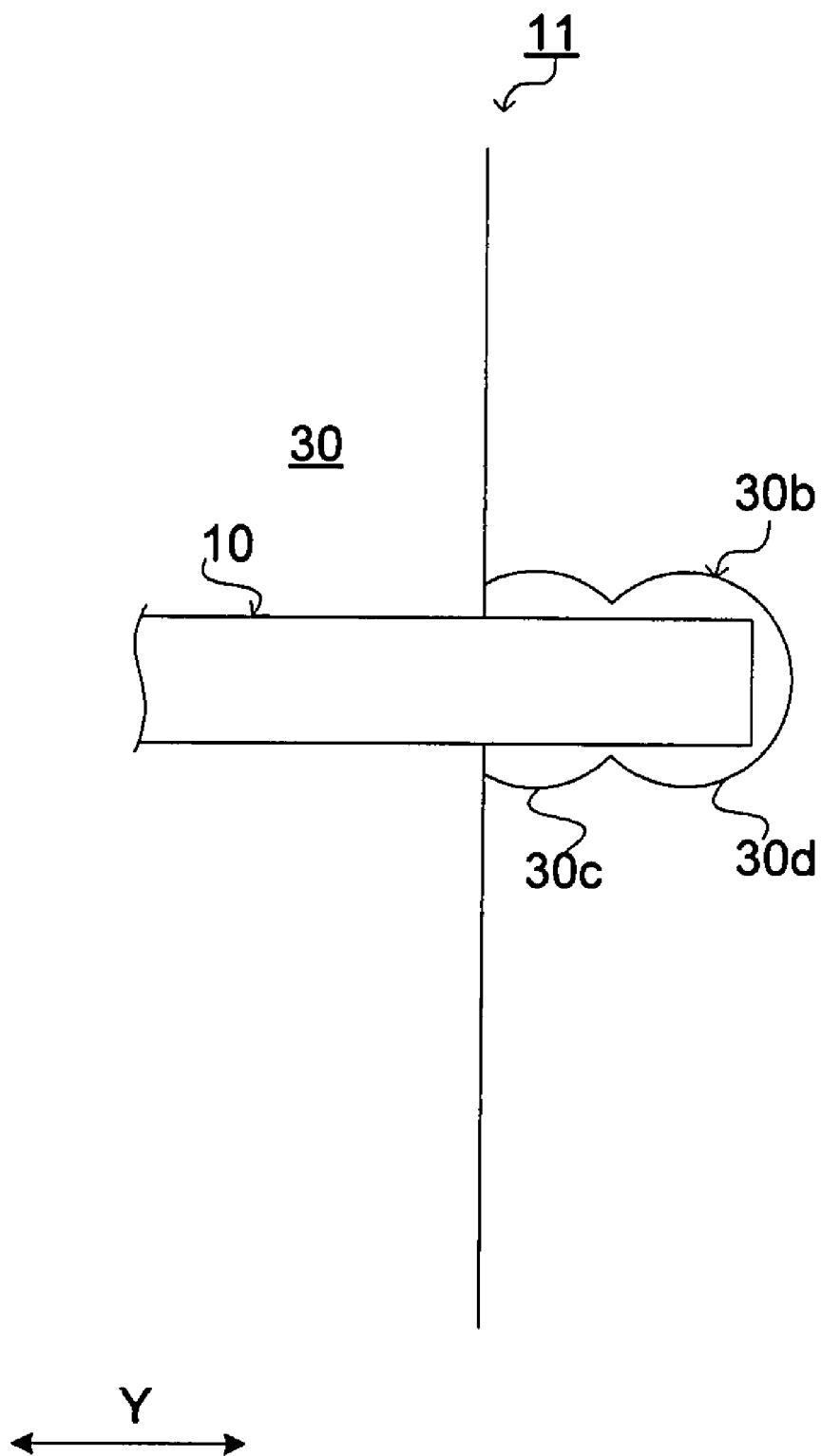
FIG. 4 is a plan view of a concave portion formed on a probe supporting plate.

A concave portion 30b is formed on the side wall upper portion on the groove 30 of the probe supporting plate 11. As shown in FIG. 4, the concave portion 30b has two round holes 30c and 30d having bottoms and open from the upper face side of the probe supporting plate 11. The round holes 30c and 30d are linearly installed adjacent to each other in the Y direction, and their side faces are connected. The round hole 30c is closer to the groove 30 side and is opened on its side face to the side wall face of the groove 30. The round hole 30d far from the groove 30 is formed deeper than the round hole 30c as shown in FIG. 2. The upper locking portion 22a of main body portion 22 of the probe 10 is formed on this concave portion 30b.

As described above, the probe 10 is locked at the upper face side of the probe supporting plate 11 by the lower locking portion 21c and the upper locking portion 22a, thereby it can be inserted and removed from the upper face side of the probe supporting plate 11.

Also, the inside of the concave portion 30b, for example, is filled with a light-curable resin, such as UV-curable resin, and the upper locking portion 22a is attached to the concave portion 30b by curing the resin by exposure to a UV ray with the upper locking portion 22a engaged in that concave portion 30a. In addition, a heat-curable resin can be used for this adhesion.

Figure 5:
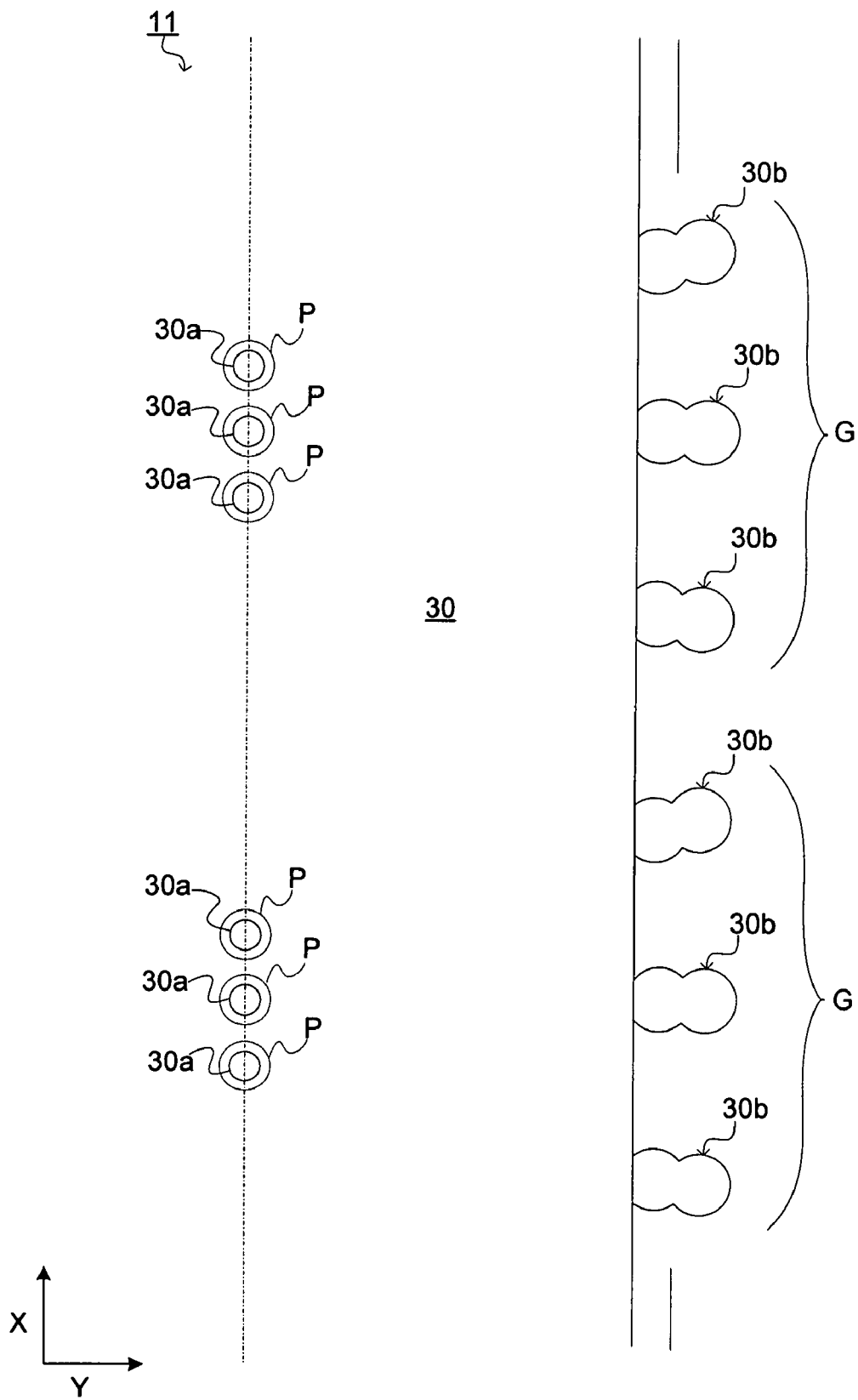
FIG. 5 is an enlarged plan view of a probe supporting plate showing a concave portion and a through-hole formed on a probe supporting plate.
Figure 6:
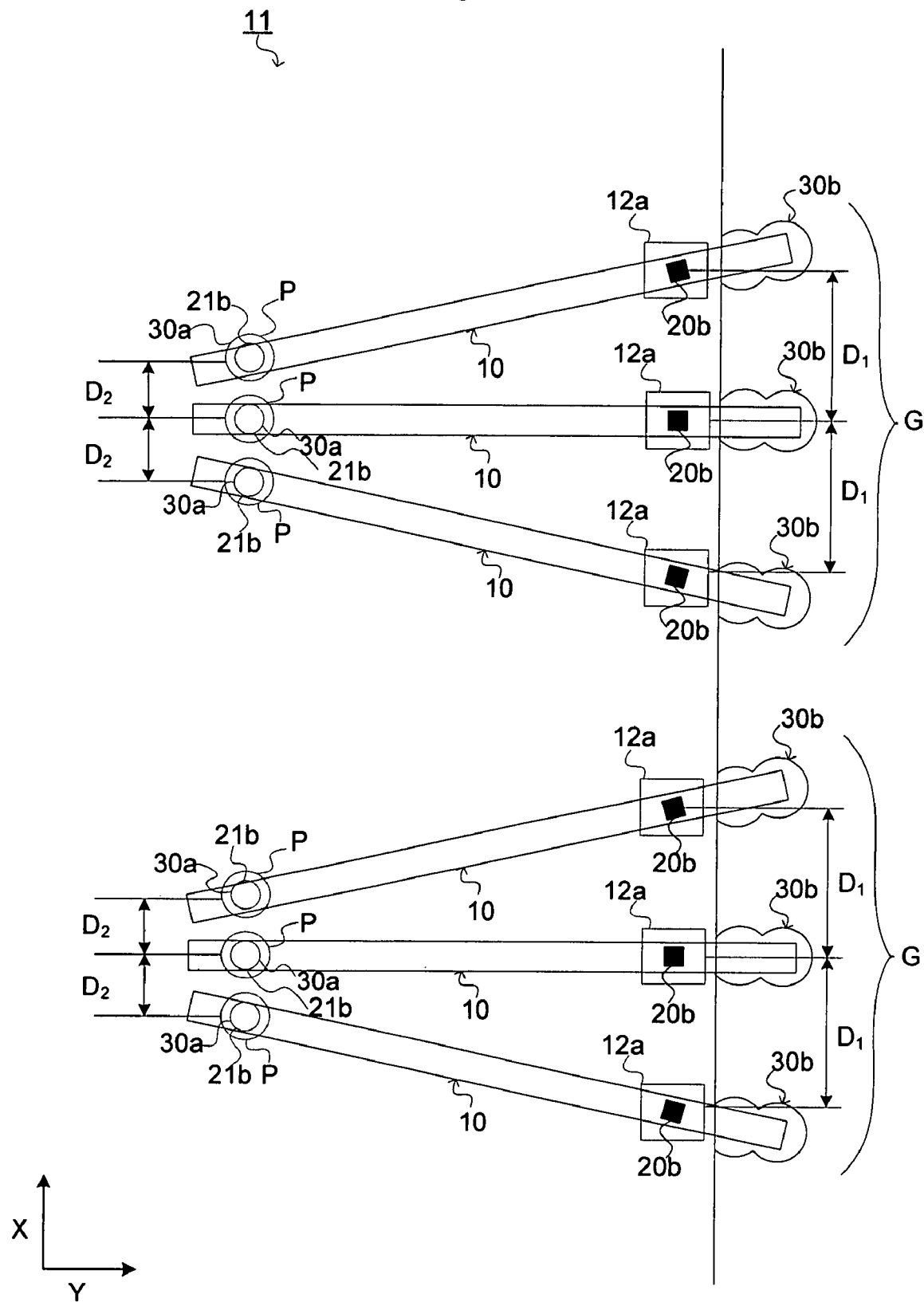
FIG. 6 is an enlarged plan view of a probe supporting plate with a probe mounted.

As shown in FIG. 5, the through-hole 30a in the groove 30 is arranged in line along the groove 30. The spacing of through-holes 30a in the groove 30 is configured to be equal to the spacing of the electrodes P of the wafer W to be examined. The concave portion 30b is formed in line along the groove 30 and is paired with the through-hole 30a. The concave portion 30b is grouped with a plurality of adjacent concave portions (three in FIG. 5), and the spacing of the concave portions 30b in each group G is wider than that of corresponding through-hole 30a. Therefore, as shown in FIG. 6, when the probes 10 are inserted to each of through-holes 30a and concave portion 30b in the same group G, the probes 10 in the group G are radiated (sector form) from the through-hole 30a side to the concave portion 30b side. This makes spacing D1 of the curvature portion 20b of the probe 10 contacting the terminal 12a of the printed wiring board 12 wider than the spacing D2 of the perpendicular portion 21b contacting the electrode P of wafer W viewed as from a plane.

The probe supporting plate 11 supporting the plurality of probes 10 is, for example, fixed to a lower face of the printed wiring board 12 with a bolt 40 as shown in FIG. 1. For example, a support 41 is formed on the lower face of the printed wiring board 12, and an outer circumference of the probe supporting plate 11 is fixed to the support 41 with the bolt 40. In addition, the probe supporting plate 11 can be fixed to the printed wiring board 12 with other fixing members, such as a leaf spring, instead of bolt 40.

The chuck 3 is formed in a virtual disc shape having a horizontal upper face. The upper face of chuck 3 is provided with an aspiration outlet 3a to perform vacuum holding of the wafer W. The aspiration outlet 3a is, for example, connected to an aspiration tube 3b that leads to an external negative pressure generator 50 through the chuck 3.

The moving mechanism 4 is, for example, provided with an elevation drive portion 60, such as a cylinder to elevate the chuck 3, and an X-Y stage 61 to move the elevation drive portion 60 in two directions (X direction and Y direction) perpendicular to the horizontal directions. This allows three-dimensional movement of the wafer W retained by the chuck 3, and specific probes 10 located upward can be contacted to each electrode P on the surface of wafer W.

Next, an examination process performed by the probe 1 configured as above will be discussed. At first, the wafer W is vacuum held and retained on the chuck 3. Then, the chuck 3 is moved in the X-Y direction by the moving mechanism 4 and the position of a wafer W is adjusted. Thereafter, the chuck 3 is elevated and each electrode P on the wafer W is pressed and contacted to each probe 10 of the probe card 2.

Thereafter, an electrical signal for an examination is transmitted from the tester 5 to each probe 10 through the printed wiring board 12, and the electric signal is transmitted from each probe 10 to each electrode P on the wafer W, then electrical characteristics of the electrical circuit on the wafer W are examined.

According to above embodiment, the plurality of probes 10 can be locked to the probe supporting plate 11 such that the spacing D2 between the perpendicular portions 21b of the lower end of the probe 10 is smaller than the spacing D1 between the curvature portions 20b on the upper end of the probe 10, so that the probe 10 itself can convert the pitch of terminal 12a of the printed wiring board 12 into the pitch of the electrode P of the wafer W without using a conventional contactor with fine wiring, thereby the wafer W with small electrode P spacing can be examined sufficiently. This simplifies the production of the probe card 2 and the probe card 2 can be manufactured inexpensively in a short period of time. Also, the probe supporting plate 11 can be large in size because there is no need to form a fine wiring like a conventional contactor. For this reason, the probe supporting plate 11 can support a large number of probes 10 and examine a large number of electrodes P at a time. The probe 10 directly contacts the terminal 12a of the printed wiring board 12, thus electrical contact points are less than a conventional technique, thereby the examination can be done much faster and more accurate with high reliability.

Further, since the probe 10 can be inserted and removed freely from the probe supporting plate 11, the probe 10 can easily be exchanged when, for example, a portion of the probe 10 is damaged. Also, the probe 10 is not metal joined like a conventional technique, so it does not electrically damage the joint portion when exchanging a probe 10. In addition, for example, the probe 10 can be replaced with one having a different length of perpendicular potion 21b, so that the height of probe 10 or other changes according to the apparatus specification can be easily adjusted.

In the above embodiment, the groove 30 is formed on the probe supporting plate 11, a plurality of through-holes 30a and concave portions 30b are formed along the groove 30, and corresponding locking portions 21c and 22a are formed on the probe 10, thus the probe supporting plate 11 locks each probe 10 at two positions and number of probes 10 can be supported sufficiently.

In the embodiment above, the upper contact 20 with elasticity is formed on the upper portion of the probe 10 so that, for example, the electrical contact between the printed wiring board 12 and the probe 10 can be ensured while absorbing the distortion of the probe supporting plate 11 and the printed wiring board 12. Especially, in this embodiment, there is no conventional interposer so that the number of parts for the probe card 2 is small thus the structure of the probe card 2 can be simplified. For this reason, the probe 2 can further be manufactured easily and the cost can be reduced as well. In addition, less electrical contact points exist thus examination speed and accuracy for electrical characteristics can be improved.

Also, the lower contact 21 with elasticity is formed on the lower portion of the probe 10, so that the lower contact 21 moves on the surface of the electrode P when pressing the lower contact 21 to the electrode P of the wafer W, thus the oxide film on the surface of the electrode P on the wafer W can be shaved off adequately. The main body portion 22 of the probe 10 is formed in a plate shape, thus the product management of the probe 10 can be made easily, for example, by describing a lot number of the probe 10, while maintaining the rigidity of the probe 10.

The concave portion 30b on the probe supporting plate 11 is comprised of two round holes 30c and 30d, the holes to lock probes 10 can be formed easily, for example, by a drilling process. The concave portion 30b can be formed on an accurate position by the drilling process thereby the positioning accuracy of the probes 10 can be improved.

In addition, the concave portion 30b has two round holes 30c and 30d, however, holes are not limited to two. Also, the configuration of concave portion 30b is not limited to the round hole, and it may be an elongate hole that is long in one direction viewed from a plane.

Figure 7:
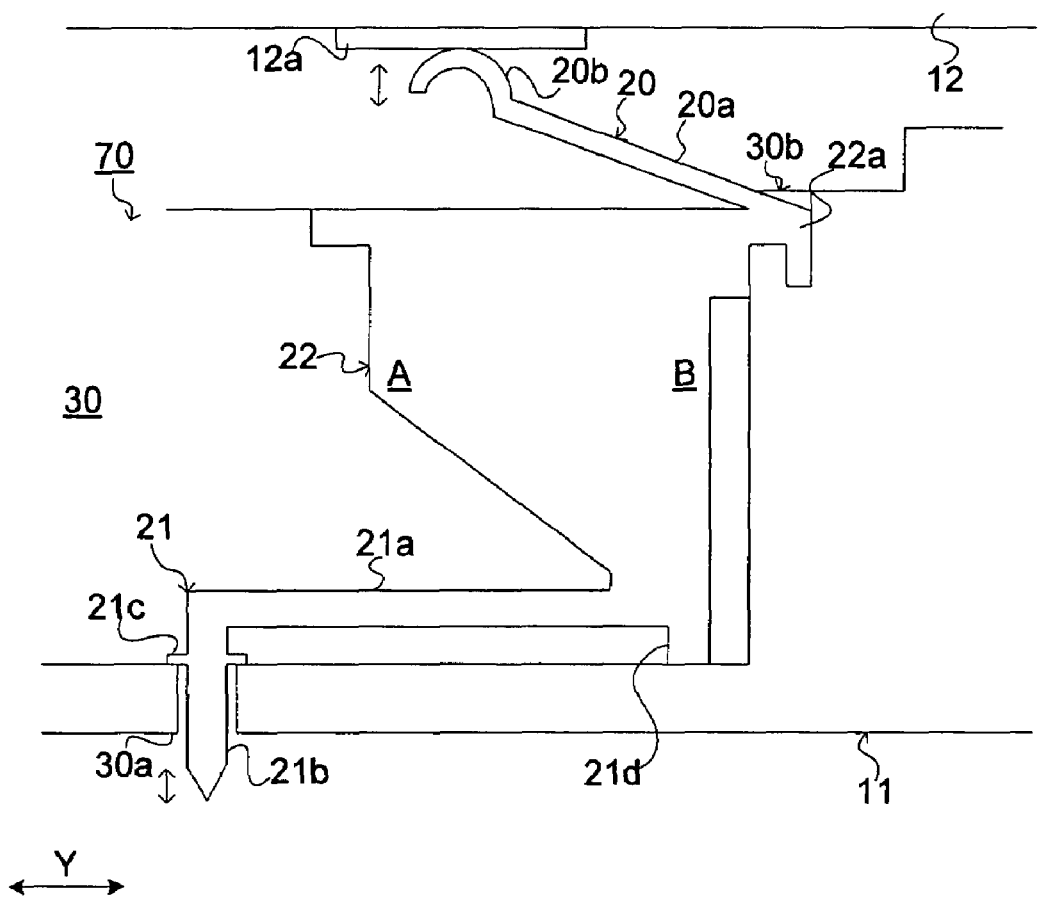
FIG. 7 is a longitudinal section of a probe supporting plate having a probe having a different curve position is locked.
Figure 8:
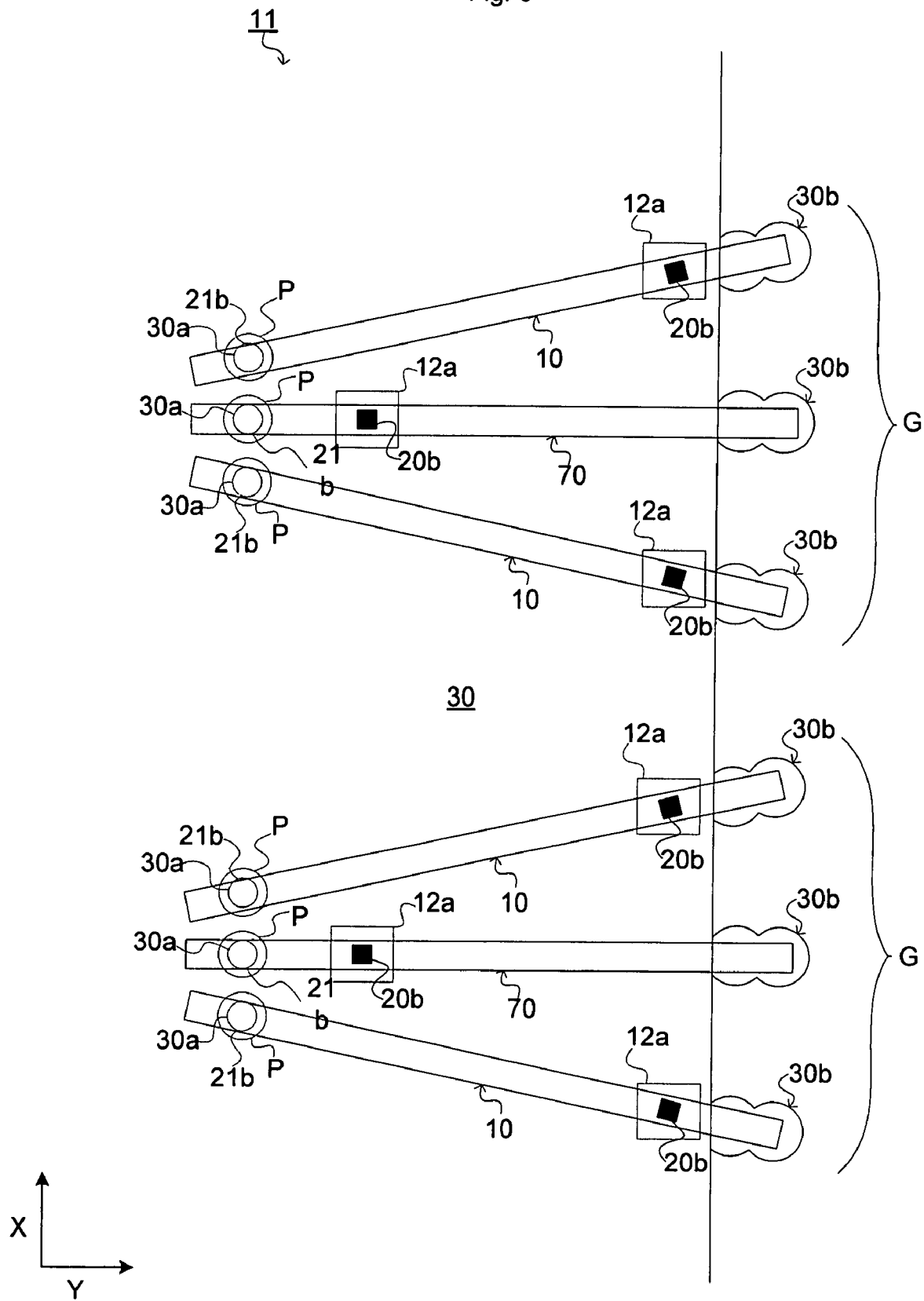
FIG. 8 is an enlarged plan view of a probe supporting plate with the probe of FIG. 7 mounted thereon.

In the above embodiment, as shown in FIG. 6, the probes 10 with the same distance for the curvature portion 20b contacting the terminal 12a of the printed wiring board 12 and the perpendicular portion 21b contacting electrode P of the wafer W viewed from a plane, are used, however, a plurality of types of probes that have a different distance of the curvature portion 21b and the perpendicular portion 21b may be used. For example, as shown in FIG. 7, in a portion of probes 70, the beam portion 20a of the upper contact 20 is formed obliquely upward from the other end B side to the one end A side, and the curvature portion 20b may be formed on its top end portion. For this probe 70, the curvature portion 20b is positioned on the one end A side compared to the probe 10 described above. In addition, other configurations of the probe 70 are the same as that of the probe 10, thus identical names and symbols are used and their explanations are omitted. And, as shown in FIG. 8, on the probe supporting plate 11, for example, probes 70 are arranged between two probes 10 within the group G and the probes 10 and probes 70 are arranged alternately. In probes 70, the distance from the curvature portion 20b to the perpendicular portion 21b viewed from a plane is shorter compared to the probe 10. In this case, each terminal 12 corresponds to each of curvature portions 20b for the probe 10 and probe 70, and is formed on the printed wiring board 12.

According to this example, the probes can be used on a printed wiring board with a complicated wiring pattern. Meanwhile, the forming position of the terminal 12a of the printed wiring board 12 can further be designed freely. In addition, for the probes 10 and 70, the distance from the curvature portion 20b to the perpendicular potion 21b can be configured arbitrarily by changing the length of the beam portion 20a of the upper contact 20. Also, the probe with a different distance of the curvature portion 20b and the perpendicular portion 21b is not limited to two types and may be three or more types.

Figure 9:
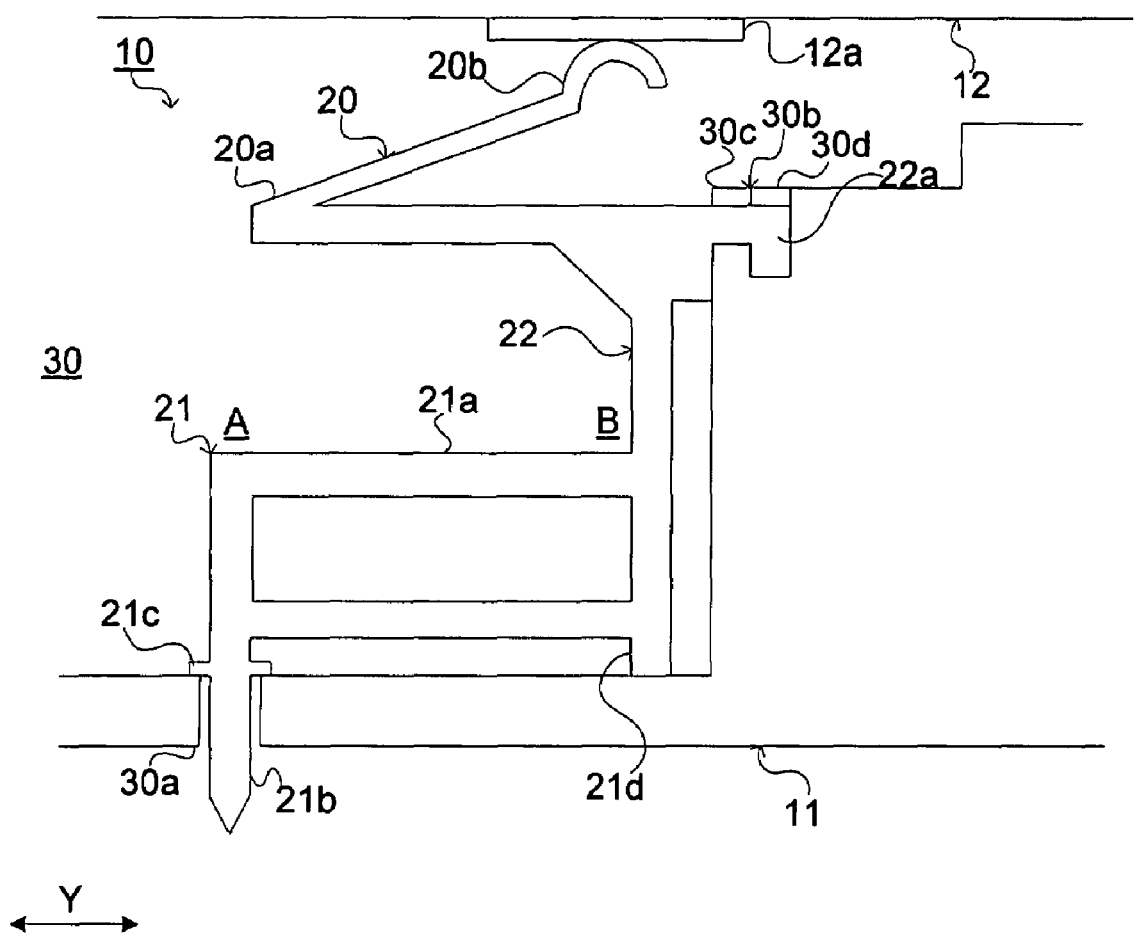
FIG. 9 is a longitudinal section of a probe supporting plate with a probe having two beams on lower contact, locked.

Also, in the probe 10 described in the above embodiment, the lower contact 21 having two horizontal beam portions 21a, as shown in FIG. 9, and the perpendicular portion 21b may be formed on the top end of those two beam portions 21a. In this case, the main body portion 22 may have a linear shape extending in a perpendicular direction that connects the end portion of the other end B side of the two beam portions 21a and the upper contact 20. Even in this case, rigidity and elasticity in the vertical direction of the probe 10 can be secured, thus contact of the probe 10 and the printed wiring board 12 can be properly maintained.

Figure 10:
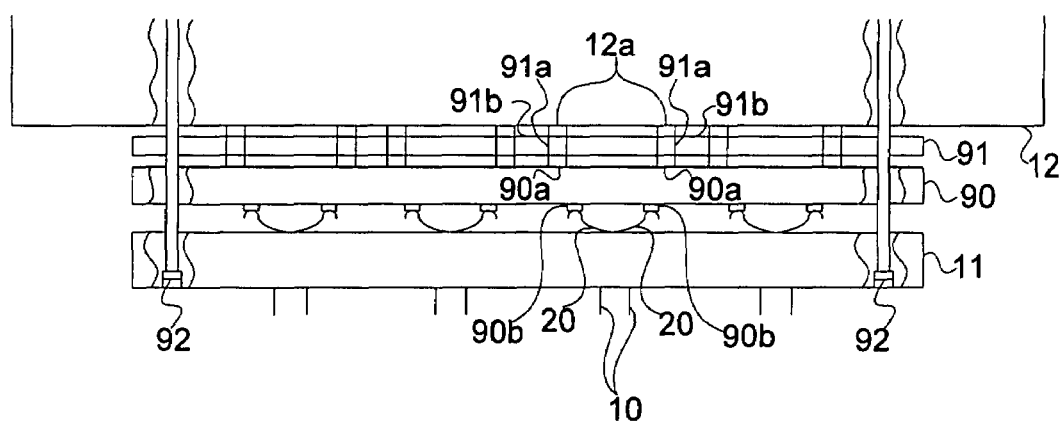
FIG. 10 is an explanatory diagram showing an outline of a configuration for a probe card comprising a connection plate and an elastic member.

In the embodiment above, the probes 10 of the probe supporting plate 11 are directly contacted to the terminals 12a of the printed wiring board 12, however, for example, the connecting plate 90 and the elasticity member 91 may be provided between the probe supporting plate 11 and the printed wiring board 12 as shown in FIG. 10. The connecting plate 90, for example, is formed in a disc shape with a depth, and an upper face terminal 90a and a lower face terminal 90b are formed on upper and lower faces of the connecting portion 90 respectively. The spacing between the lower face terminals 90b, for example, is formed smaller than that of the upper face terminals 90a. Inside the connecting plate 90, an internal wiring is formed to connect the upper face terminal 90a and the lower face terminal 90b. The upper contact 20 of the probe 10 is contacting the lower face terminal 90b.

The elastic member 91 is arranged between the connecting plate 90 and the printed wiring board 12. The elastic member 91 is, for example, formed in sheet form and configured from a plurality of conductive portions 91a having elasticity and an insulating portion 91b connecting between each of the conducting portions 91a. The conductive portion 91a is formed in a virtually cylindrical form penetrating in the direction of sheet thickness and is exposed on the upper and lower face of the sheet. The conductive portion 91a is formed by, for example, densely filling conductive particles in a high molecular material having an insulation property and an elasticity. An upper face terminal 90a of the connecting plate 90 contacts the lower end portion of this conductive portion 91a, and the terminal 12a of the printed wring board 12 contacts the upper end portion of the conductive portion 91a.

By such configuration, the probe 10 of the probe supporting plate 11 and the printed wiring board 12 are electrically conducted through the connecting plate 90 and the elastic member 91.

The probe supporting plate 11, the connecting plate 90, and the elastic member 91 are fixed to the printed wiring board 12 at their outer circumference portions by a plurality of bolts 92 which penetrate from the probe supporting plate 11 on the lower side to inside the printed wiring board 12. In addition, the lower end face of the bolt 92 is located above the lower face of the probe supporting portion 11.

In this example, the connecting plate 90 provides a wider spacing between the printed wring board 12 and the probe supporting plate 11, thus, the printed wiring board 12 and the wafer W are prevented from contacting, even when a distortion occurred to the printed wiring board 12 due to, for example, effects of thermal expansion and processing accuracy. This enables prevents the printed wiring board 12 and the wafer W from contacting thereby preventing the printed wiring board 12 and the wafer W from damage. The pitch conversion between the terminal 12a of the printed wiring board 12 and the electrode P of wafer W can be done in both the connecting plate 90 and the probes 10 of the probe supporting plate 11, thus a larger pitch conversion can be made. This enables the examination of a wafer W with a smaller pitch of the electrodes P. In addition, an internal wiring is formed in the connecting plate 90, however, it can manufactured in lower cost compared to the conventional contactor because the pitch conversion amount is small.

Also, the elastic member 91 with a conductive property is intervened between the connecting plate 90 and the printed wiring board 12, thereby, for example, distortion of the printed wiring board 12 is absorbed and enables the maintenance of the horizontality of the connection plate 90 or the probe supporting plate 11. This enables sufficient contact of the electrode P in the wafer face and each probe 10 of the probe supporting plate 11.

In addition, the elastic member 91 described in this example is not limited to a sheet form, and it can be configured, for example, by a plurality of curved metal pins.

In the above embodiment, the groove 30 is formed on the upper face side of the probe supporting plate 11 and the probe 10 is arranged in the groove 30, however, the groove may be formed on the lower face side of the probe supporting plate 11 with a plurality of probes arranged in the groove. This example is hereinafter explained.

Figure 11:
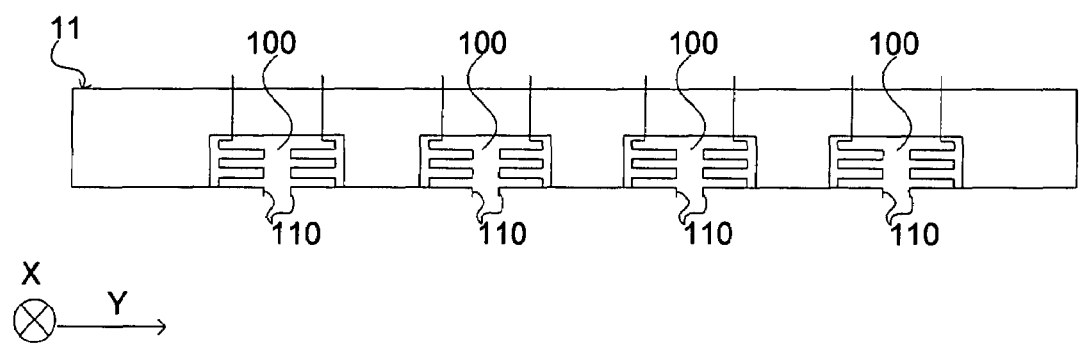
FIG. 11 is a longitudinal section showing a configuration of a probe supporting plate with a groove formed on a lower face.

For example, as shown in FIG. 11, a groove 100 in a plurality of rows along X direction as described in the above embodiment is formed on the lower face side of the probe supporting plate 11. A plurality of probes 110 are arranged in this groove 100 of the probe supporting plate 11.

Figure 12:
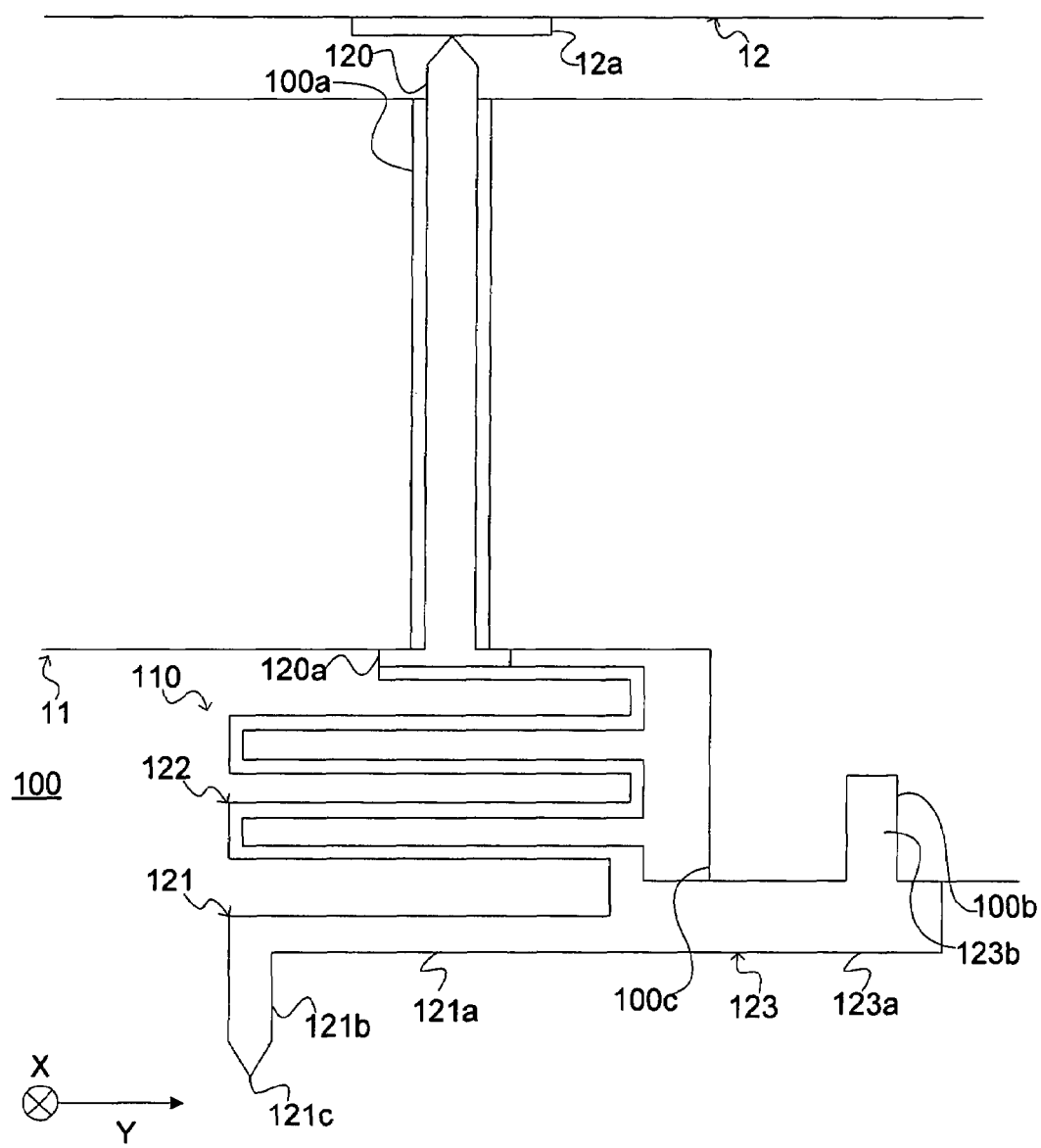
FIG. 12 is a longitudinal section of a probe supporting plate that has a probe mounted thereon.

For example, as shown in FIG. 12, the probe 110 is provided with an upper contact 120 that contacts the terminal 12a of the printed wiring board 12, a lower contact 121 to be contacted to the electrode P on the wafer W at an examination, a connecting portion 122 to connect the upper contact 120 and the lower contact 121, and a locking portion 123 to lock the probes 110 to the probe supporting plate 11.

The connecting portion 122 of probe 110 is, for example, formed in a virtually rectangular shape with a serpentine in left and right and having vertical elasticity. In addition, the shape of the connecting portion 122 is not limited to a rectangular shape, and may be in a corrugated shape. The upper contact 120 is, for example, formed linearly upward from the upper portion of the connecting portion 122. On the lower end portion of the upper contact 120, a stopper 120a larger than other potions is formed.

The lower contact 121 is connected to the lower portion of the connecting potion 122. The lower contact 121 is comprised of a beam portion 121a formed in horizontal direction from the connecting portion 122, and a perpendicular portion 121b extends downwards from the top end of the beam portion 121a, having a so called cantilever form. The position of the upper end portion of the upper contact 120 and the position of lower end portion 121c of lower contact 121 are staggered.

The locking portion 123 is mounted on the joint portion of the connecting portion 122 and lower contact 121. The locking portion 123 has a horizontal portion 123a extending in a horizontal direction opposite of the lower contact 121 from the joint portion, and a convex portion 123b protruding upward from the horizontal portion 123a.

In this embodiment, for example, three types of probes 110 (110a, 110b, 110c) that have different distances from the upper end portion of the upper contact 120 to the lower end portion 121c of the lower contact 121 viewed from a plane are used. For example, for the probe 110a, the upper contact 120 is positioned around the middle of the connecting portion 122 as shown in FIG. 13 (a), for the probe 110b, the upper contact 120 is positioned at the lower end portion 121c side of the lower contact 121 as shown in FIG. 13 (b), and for the probe 110c, the upper contact 120 is positioned opposite from the lower end portion 121c on the lower contact 121, as shown in FIG. 13 (c).

Further, three types of probes 110a, 110b, and 110c are formed such that the positions of convex portions 123b on the locking portion 123 are different from each other. For example, the convex portion 123b is the furthest from the connecting portion 122 for the probe 110a, the convex portion 123b is next-furthest from the connecting portion 122 for the probe 10b, and the convex portion 123b is closest to the connecting portion 122 for the probe 110c.

As shown in FIG. 12, a through-hole 100a penetrating through the upper face of the probe supporting plate 11 is formed on the bottom face (top face) of the groove 100 on the probe supporting plate 11. The upper contact 120 of the probe 110 is inserted through this through-hole and the upper end portion of the upper contact 120 protrudes upward of the probe supporting plate 11. Also, a stopper 120a of the upper contact 120 is locked on the lower end circumference portion of the through-hole 100a.

The concave portion 100b is formed around the groove 100 on the lower face of the probe supporting plate 11. The convex portion 123b of the locking portion 123 of probe 110 is engaged to the concave portion 100b. The inside of the concave portion 100b is, for example, filled with a light-curable resin, such as UV-curable resin and the locking portion 123 is attached to the concave portion 100b by curing the resin by exposure in an UV ray with the convex portion 123b engaged. In addition, a thermal-curable resin may be used for this adhesion.

Figure 14:
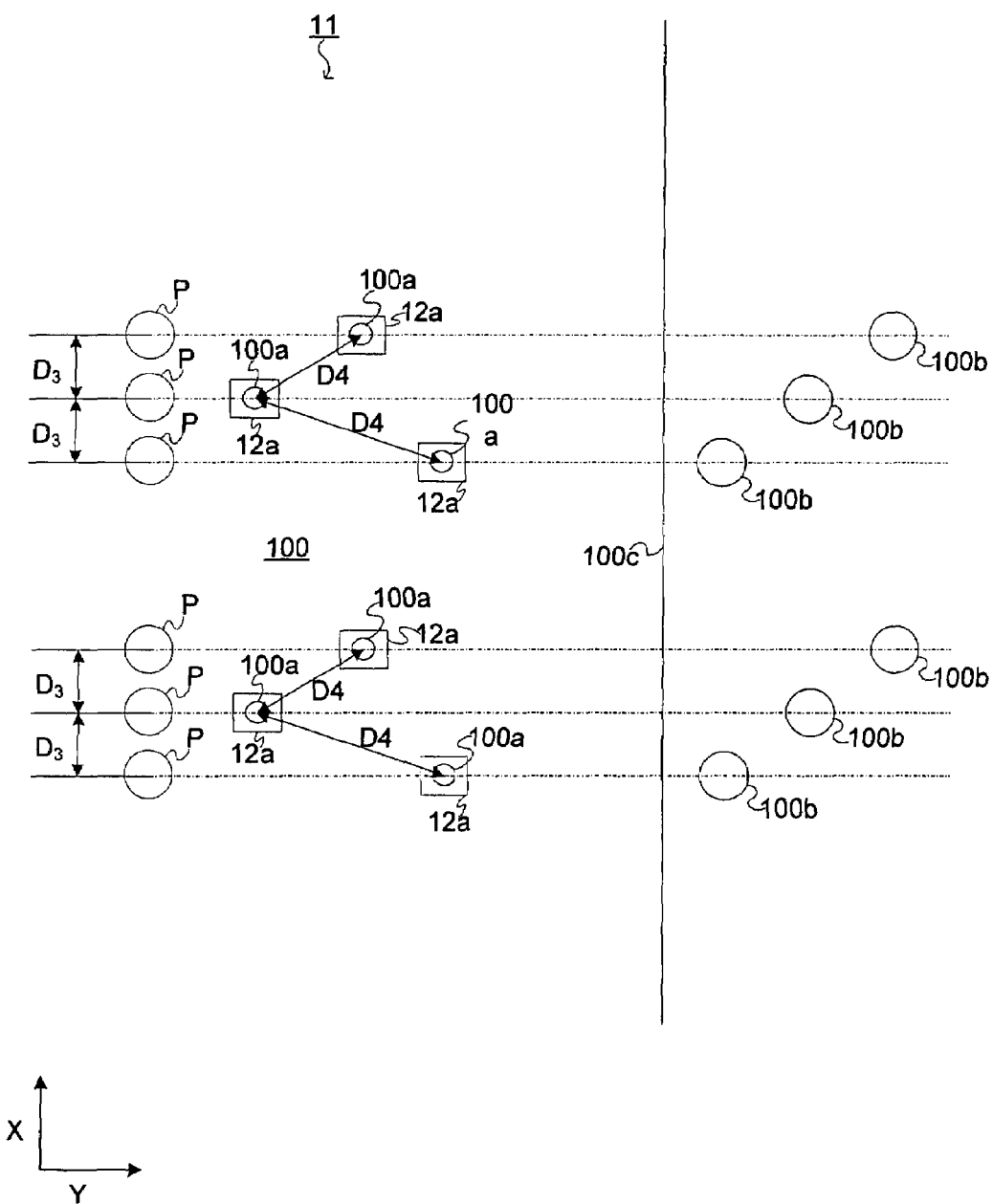
FIG. 14 is an enlarged view of a lower face of the probe supporting plate showing a concave portion and a through-hole formed on the probe supporting plate.
Figure 15:
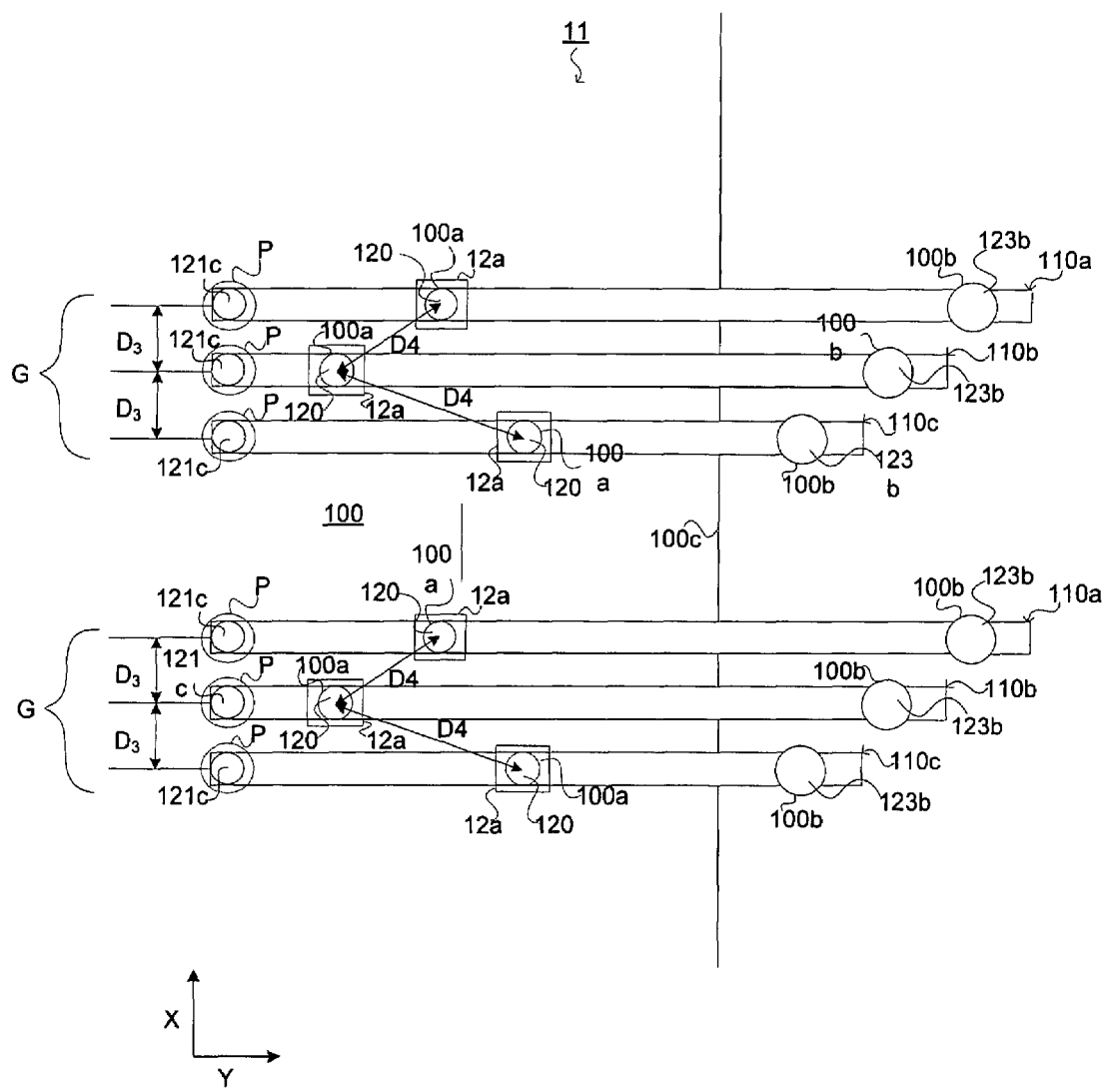
FIG. 15 is an enlarged view of a lower face of a probe supporting plate with a probe mounted thereon.

FIG. 14 shows an enlarged view of the lower face of the probe supporting portion 11. As shown in FIG. 14, the through-hole 100a and the concave portion 100b are paired, and formed colinear with the Y direction perpendicular to the direction of the grooves 100. Each of the through-hole 100a and the concave portion 100b are formed aligned in the X direction along the groove 100. For example, the concave portions 100b adjacent in the X direction are formed having different distances from the side wall portion 100c of the grooves 100c. Also, the through-hole 100a is formed on a position that corresponds to each terminal 12a of the printed wiring board 12, and the though-holes 100a, adjacent in the X direction, are formed having different distances from the side wall portion 100c of the grooves 100 (positions where different distances from the electrodes P of the wafer W to be described). As shown in FIG. 15, for these positions of the through-holes 100a and the concave positions 100b, any of three types of the probe 110 described above can be inserted to a pair of concave portions 100b and through-holes 100a, and the position of the lower portion 121c of the lower contact 121 is configured to correspond to the position of the each electrode P of the wafer W to be examined and arranged on the colinear X direction.

In this embodiment, each three through-holes 100a and concaved portion 100b adjacent to each other in the X direction are grouped, and each of three types of probes 110a, 110b, and 110c are attached to each group G in predetermined order. As a result, the spacing D3 between the lower end portions 121c of the lower contacts 121 of probes 110 adjacent each other within the group G is smaller than the spacing D4 between the upper contacts 120, thus the wider pitch of the terminals 12a of the printed wiring board 12 is converted to the smaller pitch of the electrodes P on the wafer W by these probes 110.

According to this embodiment, the plurality of probes 110 can be locked to the probe supporting plate 11, such that the spacing between the lower end portions 121c of the lower contact 121 of probe 110 is smaller than that of the lower contacts 120, so that the probe 110 can convert the wider pitch of the terminals 12a of the printed wring board 12 to the smaller pitch of the electrodes P of the wafer W, thereby the wafer W with a smaller pitch of electrodes P can be examined sufficiently. In this case, because a conventional contactor with a complicated fine wiring structure is not necessary, the production of probe card 2 is simplified and the probe cards 2 can be manufactured inexpensively in a short period of time.

Each of the adjacent concave portions 110b are in different distances from the groove 100, thus each of concave portion 100b does not interfere with each other even when the spacing in the X direction is made smaller. This enables probe 110 to be arranged in the X direction with a small pitch, and as a result, the electrode P with a small pitch can be examined.

In the above embodiments, three types of probes 110 with different distances from the upper contact 120 to the lower end portion 121c of the lower contact 121 viewed from a plane are used, however, it is not limited to three types, it may be two types, or 4 types or more.

Figure 16:
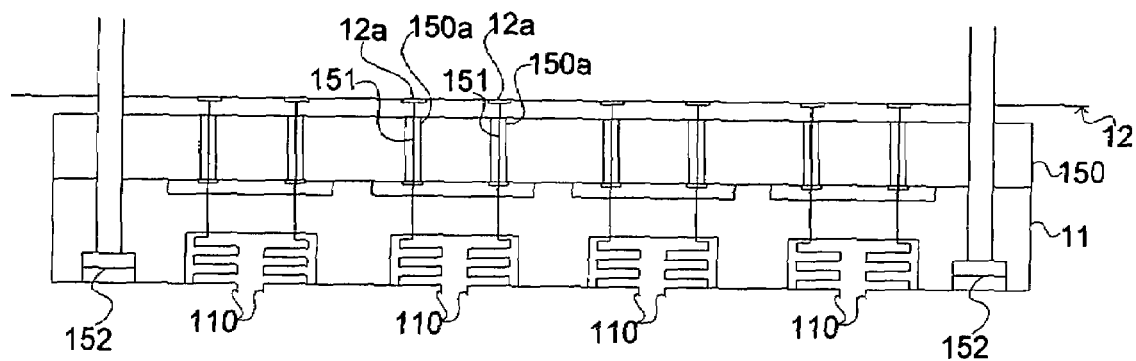
FIG. 16 is a longitudinal section showing a configuration of a probe card comprising a connection plate.
Figure 17:
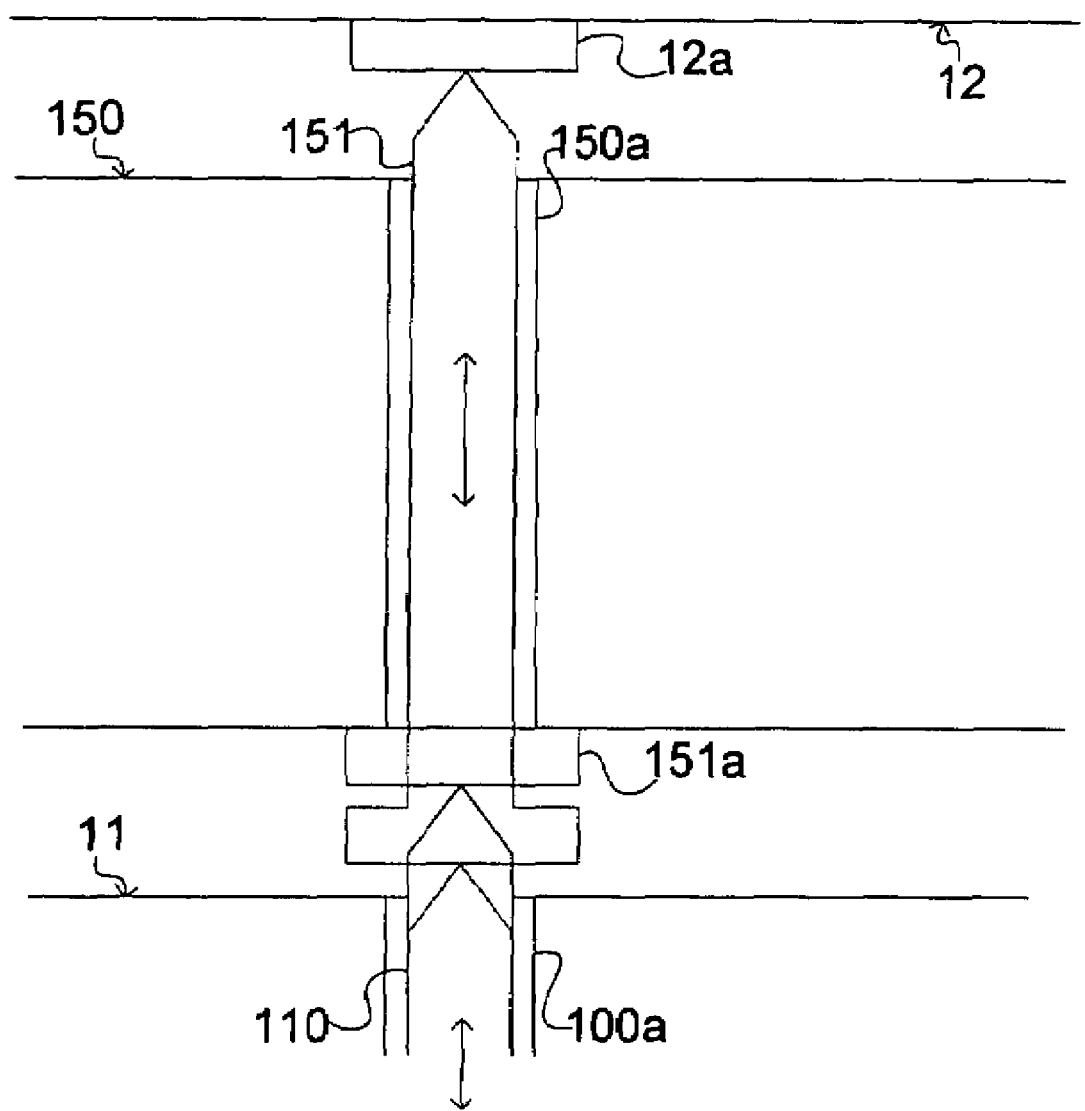
FIG. 17 is an enlarged cross section view of a mounting position for a metal pin of the connection plate.

In the above embodiment, a connecting plate 150 may be provided between the printed wiring board 12 and the probe supporting plate as shown in FIG. 16. This connecting plate 150 is, for example, has a disc shape with a depth and formed with a glass. A plurality of through-holes 150a penetrate vertically and are formed on the connecting plate 150. A metal pin 151 is inserted to each through-hole 150a as a linear shape conductive member. The metal pin 151 is smaller than the diameter of the through-hole 150a as shown in FIG. 17, and able to freely move vertically, against the through-hole 150a. The metal pin 151 protrudes vertically from the thoughhole 150a and is longer than the through-hole 150a. On the lower end portion of the metal pin 151, for example, a stopper 151a which is larger than the diameter of the through-hole 150a, is formed. As shown in FIG. 16, the probe supporting plate 11 and the connecting plate 150 are fixed to the printed wiring board 12 with a plurality of bolts 152 penetrating from the probe supporting plate 11 on the lower side to inside the printed wiring board 12 at their outer circumference. In addition, the lower end faces of the bolts 152 are located above the lower face of the probe supporting portion 11. In this way, as shown in FIG. 17, the metal pin 151 is pushed up by the upper contact 120 of the probe 110 and the upper end portion of the metal pin 151 contacts the terminal 12a of the printed wiring board 12. This allows the electrical conduction of the probe 110 and the printed wiring board 12.

In this example, the spacing between the printed wiring board 12 and the probe supporting plate 11 is widened by the connecting plate 150, thus contact of the printed wiring board 12 and the wafer W can be prevented, even when, for example, distortion has occurred to the printed wiring board 12 due to thermal expansion or processing accuracy. This prevents damage to the printed wiring board 12 or wafer W. Also, the electrical conduction of the printed wiring board 12 and the probe 110 has been made through the metal pin 151 that can move freely within the through-hole 150a, and distortion can be absorbed by the elasticity of the probe 110 located under the metal pin because the metal pin 151 follows the distortion and vertically moves even when, for example, the printed wiring board 12 is distorted due to a problem of processing accuracy. This stabilizes the height of the lower end portions 121c of each probe 110 and the contact of the electrode P within the wafer face and the probes 110 can be made properly.

The preferred embodiment of the present invention has been described in reference to the accompanying drawings; however, the present invention is not limited to such an example. It should be appreciated that one skilled in the art can think up various variations and modifications within ideas described in the claims, and such variations and modifications fall within a technical scope of the present invention. For example, the probe 10, 110, and the probe supporting plate 11 are not limited to the form described in this embodiment and can be in another form. The present invention can also be applied to a case where the examination object is a substrate such as an FPD (flat panel display) other than the wafer W.

The current invention is useful in realizing a probe card which can respond to an examination object with small electrode spacing, and is easy and inexpensive to manufacture.

What is claimed is:

1. A probe card comprising;
   a circuit board structured to transmit an electric signal to a plurality of probes;
   a probe supporting plate located on a lower face side of said circuit board with a plurality of probes inserted in a vertical direction; and
   a connecting plate positioned between said circuit board and said probe supporting plate to electrically connect said circuit board and each probe on said probe supporting plate;
   wherein on the probe supporting plate, an upper end portion of each of said plurality of probes protrudes upward of said probe supporting;
   a lower end portion of each of said plurality of probes protrudes downward of said probe supporting plate,
   wherein each of said plurality of probes comprises at least an upper portion, a main body portion and a lower portion, where the main body portion comprises a connecting portion with the upper portion positioned substantially at a middle of the connecting portion;
   wherein said main body portion deflects when said upper portion contacts said circuit board;
   wherein a groove is formed on a lower face side of said probe supporting plate, and a through-hole is formed on a bottom face of said groove;
   wherein a plurality of concave portions are formed along said groove on a lower face adjacent to said groove on said probe supporting plate;
   wherein each probe comprises a locking portion to lock said probe to said probe supporting plate; and
   a concave portion is formed on said locking portion.

2. The probe card according to claim 1, wherein said locking portion of each probe is adhered to said concave portion with a resin curable by light or heat.

3. The probe card according to claim 1, wherein each of said adjacent concave portions is formed at a different distance from said groove.

4. The probe card according to claim 1, wherein said main body portion of said probe comprises either a corrugate or a rectangular shape.

5. The probe card according to claim 1, wherein said locking portion of each probe is attached to a joint portion of said main body portion and a lower portion.

6. The probe card according to claim 5, wherein said lower portion of said probe comprises a perpendicular portion having said lower end portion; and a beam portion formed in a horizontal direction from said lower portion of said main body portion and connected to said perpendicular portion at a top end of the probe.

* * * * *